United States Patent
Mühlbrandt et al.

(10) Patent No.: US 10,276,734 B2
(45) Date of Patent: Apr. 30, 2019

(54) PLASMONIC COMPONENT AND PLASMONIC PHOTODETECTOR AND METHOD FOR PRODUCING SAME

(71) Applicant: Karlsruher Institut für Technologie, Karlsruhe (DE)

(72) Inventors: Sascha Mühlbrandt, Wiernsheim (DE); Jürg Leuthold, Überweningen (CH); Manfred Kohl, Stutensee (DE)

(73) Assignee: Karlsruher Institut Für Technologie, Karlsruhe (DE)

( * ) Notice: Subject to any disclaimer, the term of this patent is extended or adjusted under 35 U.S.C. 154(b) by 239 days.

(21) Appl. No.: 15/313,375

(22) PCT Filed: May 27, 2015

(86) PCT No.: PCT/EP2015/001088
§ 371 (c)(1),
(2) Date: Nov. 22, 2016

(87) PCT Pub. No.: WO2015/180841
PCT Pub. Date: Dec. 3, 2015

(65) Prior Publication Data
US 2017/0194514 A1   Jul. 6, 2017

(30) Foreign Application Priority Data

May 27, 2014   (DE) .................. 10 2014 007 936

(51) Int. Cl.
*H01L 31/0232* (2014.01)
*H01L 31/0224* (2006.01)
(Continued)

(52) U.S. Cl.
CPC ........ *H01L 31/0232* (2013.01); *G02B 6/1226* (2013.01); *H01L 31/022408* (2013.01); *G02B 2006/12123* (2013.01)

(58) Field of Classification Search
CPC .......... H01L 27/1446; H01L 31/02327; H01L 31/09; H01L 31/035236; H01L 31/005;
(Continued)

(56) References Cited

U.S. PATENT DOCUMENTS

| 2004/0145026 A1* | 7/2004 | Sun .................... G02B 6/30 257/459 |
| 2010/0213565 A1* | 8/2010 | Bui .................... H01L 27/1446 257/447 |

(Continued)

FOREIGN PATENT DOCUMENTS

DE     60133365 T2    4/2009

OTHER PUBLICATIONS

Casalino, M., et al., "Asymmetric MSM Sub-Bandgap All-Silicon Photodetector with Low Dark Current", Optics Express, Nov. 18, 2013, vol. 21(23), pp. 28072-28082, doi:10.1364/OE.21.028072.

(Continued)

*Primary Examiner* — Joseph Galvin, III
(74) *Attorney, Agent, or Firm* — McDonnell Boehnen Hulbert & Berghoff LLP

(57) ABSTRACT

The present invention relates to plasmonic components, more particularly plasmonic waveguides, and to plasmonic photodetectors that can be used in the field of microoptics and nanooptics, more particularly in highly integrated optical communications systems in the infrared range (IR range) as well as in power engineering, e.g. photovoltaics in the visible range. The present invention also specifies a method for producing a plasmonic component, more particularly for photodetection on the basis of internal photoemission.

14 Claims, 11 Drawing Sheets

(51) Int. Cl.
*G02B 6/122* (2006.01)
*G02B 6/12* (2006.01)

(58) Field of Classification Search
CPC ........ H01L 31/022408; H01L 31/0232; G02B 6/1226
See application file for complete search history.

(56) References Cited

U.S. PATENT DOCUMENTS

| | | | | |
|---|---|---|---|---|
| 2011/0203656 A1* | 8/2011 | Kuang | ............ | H01L 31/022425 136/256 |
| 2012/0280345 A1* | 11/2012 | Zhu | ............ | G02B 6/1226 257/432 |
| 2013/0094029 A1* | 4/2013 | Bienstman | ............ | G01N 21/7746 356/517 |
| 2014/0139353 A1* | 5/2014 | Wojcieszak | ............ | A43B 3/001 340/870.16 |

OTHER PUBLICATIONS

Chen, T.P., et al., "Current Transport and its Effect on the Determination of the Schottky-Barrier Height in a Typical System: Gold on Silicon", Solid-State Electronics, Jan. 4, 1993, vol. 36(7), pp. 949-954.

Cowley, A.M., "Titanium-Silicon Schottky Barrier Diodes", Solid-State Electronics, Aug. 14, 1969, vol. 12, pp. 403-414.

Knight, M.W., et al., "Photodection with Active Optical Antennas", Science, May 6, 2011, vol. 332, pp. 702-704, doi:10.1126/science.1203056.

Raley, N.F., et al., "Vertical Silicon Membranes for Super-Schottky Diodes", IEEE Transactions on Magnetics, May 1983, vol. Mag-19(3) Part 1, pp. 507-511.

Solin, S.A., et al., "Room Temperature Extraordinary Magnetoresistance of Nonmagnetic Narrow-Gap Semiconductor/Metal Composites: Application to Read-Head Sensors for Ultrahigh-Density Magnetic Recording", IEEE Transactions on Magnetics, Jan. 2002, vol. 38(1), pp. 89-94.

International Search Report received from the International Searching Authority dated May 27, 2014, for International Application No. PCT/EP2015/001088. (English translation).

International Written Opinion received from the International Searching Authority dated May 27, 2014 for International Application No. PCT/EP2015/001088.

German Office Action dated May 5, 2015 for German Patent Application No. DE10201400936.8.

International Preliminary Report on Patentability received from the International Bureau dated Dec. 8, 2016, for International Application No. PCT/EP2015/001088. (English translation).

\* cited by examiner

D)

E)

PLASMONIC COMPONENT AND PLASMONIC PHOTODETECTOR AND METHOD FOR PRODUCING SAME

CROSS-REFERENCE

This application is a section 371 of International application no. PCT/EP2015/001088, filed May 27, 2015 which claims priority from German Patent application no. 10 2014 007 936.8, filed May 27, 2014.

FIELD

The present invention relates to plasmonic components, in particular plasmonic waveguides, and plasmonic photodetectors which can be used in the field of micro- and nano-optics, in particular in highly integrated optical communications technology in the infrared range (IR range) and also in energy technology, e.g. photovoltaics in the visible range. In addition, the present invention specifies a method for producing a plasmonic component, in particular for photodetection on the basis of internal photoemission.

BACKGROUND

The field of integrated photonics, in particular the integration of photonics into established silicon chip technology, has been a very active field of research for some years and promises great practical benefit in the combination and fusion of electronic and optical data transmission and data processing. Nano-photonic systems having high complexity and a multiplicity of functions can thus be implemented in an extremely small space and can be produced industrially. In this case, waveguide structures play an important part in particular for the optical connection of integrated photonic systems among one another (chip-chip connections) and for connection within a photonic system (on-chip connections).

However, the optical connections between individual photonic systems prove again and again to be a significant technological hurdle for commercial implementation. Thus, both with regard to the positioning accuracy and with regard to the quality or optical quality of such optical connections, requirements are made which can be achieved only with difficulty in the manufacture of large scale integrated circuits. Optical connections for example on the basis of conventional optical fibers which are coupled directly to the chip in any case require a very large number of work steps which are not automatable at all or are automatable only with difficulty, and lead to comparatively low integration densities of chip-chip connections. This in turn leads to high production costs and unit costs.

The technology of the optical connections for integrated photonic systems is thus of crucial importance for the development of photonic circuits. For this purpose, in the past a range of different approaches were put forward for improving the production of photonic connection waveguides in integrated photonic systems. In particular, there were various approaches for integrating optical connections into integrated circuits (ICs) on the basis of CMOS technology which are based on different physical effects. These also include the utilization of an internal photoemission effect for photodetection or light detection.

The term photodetectors generally denotes electronic components which convert light into an electrical signal on the basis of the photoelectric effect or exhibit an electrical resistance dependent on the incident radiation. In this case, the functioning is based on the absorption of light in the form of photons and the subsequent separation of the charge carriers generated by light. Conventional photodiodes are based on the principle that, by means of the absorption of the photons, electrons are raised from the valence and into the energetically higher conduction band, for which purpose the energy of the individual photon must correspond at least to the band gap of the irradiated semiconductor. In this case of linear interaction, however, a large detection area is needed in order to increase the efficiency of the photodiodes. Therefore, conventional photodiodes, for example on the basis of germanium, allow comparatively low integration densities of chip-chip connections.

Very recently there were various approaches for overcoming the disadvantages of conventional photodetectors with utilization of internal photoemission—the field of plasmons.

Surface plasmons are electromagnetic surface waves which are coherently coupled to charge carrier density fluctuations and are bound to interfaces between a metal and an insulator/semiconductor. Analogously to the photon, the quantum of a light wave, the plasmon denotes the quantum of a charge carrier density wave passing through a plasma. In the sense of wave-particle duality, however, plasmon denotes not only the quantum of the wave field but also the continuous charge carrier density wave as a whole. On account of their hybrid character on the basis of electrons and photons, surface plasmons can be used for transmitting information, the advantages residing in the small spatial extent of plasmonic components. The small extent enables low capacitances and thus short reaction times to external electric fields. Surface plasmons are not subject to the diffractive limits of wave mechanics and are distinguished by an amplified electromagnetic field, as a result of which an amplified interaction between light and matter, in particular in the form of nonlinear interaction, occurs. This nonlinearity is fundamentally comparable with that of two-photon absorption, which exhibits a quadratic dependence on the light intensity (power).

The plasmon at a metal-semiconductor interface decomposes as a result of absorption in the metal, high-energy electrons, so-called "hot electrons", being generated precisely at the interface with the semiconductor. Said hot electrons are able to overcome the potential barrier between semiconductor and metal, which leads to a light-induced charge separation and hence a measurable current. This process is known as internal photoemission. In this case, the potential barrier can be overcome either directly or else in the form of quantum mechanical tunnel effects. The probability of the charge carriers overcoming the potential barrier is determined by an exponential function of the barrier form, e.g. width and height, and of the charge carrier energy.

In order to utilize internal photoemission for light detection, various metal-semiconductor geometries were proposed in the past. By way of example, M. W. Knight et al., Science, Vol. 332 (6030), pp. 702-704 (2011), describe photodetection using active optical antennas, wherein use is made of nanoantennas embedded in silicon in the form of rectangular gold wires. Furthermore, photonic waveguides coated with metals, as described for example in M. Casalino et al., Optics Express, Vol. 21 (23), pp. 28072-28082 (2013), are used as photodetectors.

These approaches attempted to position the non-absorbing counterelectrode as far away as possible from the absorbing electrode, in order to generate as little power loss as possible in the counterelectrode. However, this is associated with long charge carrier drift times. Fundamental problems of these approaches were low quantum efficiencies of less than one percent in the case of nanoantennas on account of poor coupling to the electromagnetic wave, and a small electrical bandwidth, which is approximately 1 GHz in the case of the above-described waveguides in the low GHz range.

SUMMARY

The present invention is therefore based on the object of providing ultracompact plasmonic components, in particular in the form of plasmonic waveguides, and plasmonic photodetectors having an increased quantum efficiency and an improved electrical bandwidth which allow a higher integration density in comparison with conventional photodiodes. In particular, the object of the present invention is to provide a flexible production process for a plasmonic component comprising different metals and having the properties mentioned above, but without producing a short circuit between the metals, and also for a corresponding plasmonic photodetector.

This object is achieved by means of the embodiments of the present invention which are characterized in the claims.

DESCRIPTION OF THE DRAWINGS

The present invention is explained in greater detail below on the basis of non-limiting examples with reference to the accompanying figures listed below and accompanying List of reference signs.

LIST OF REFERENCE SIGNS

Figure 1:
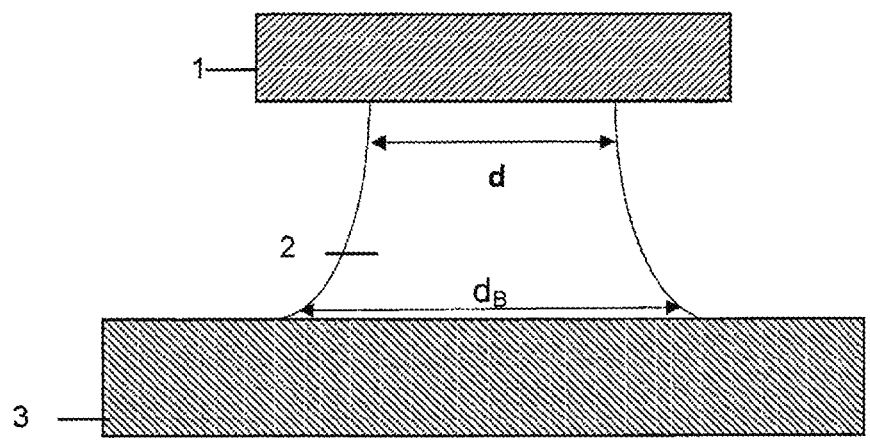
FIG. 1: shows a schematic illustration of an exemplary contour of the metal-semiconductor-metal contact to be produced with a substrate, a semiconductor layer and an oxide layer.

1 Oxide layer
2 Semiconductor layer
3 Substrate
4 First metal layer
5 Second metal layer
6 Resist
d Thickness of the semiconductor layer
$d_B$ Maximum thickness of the semiconductor layer
10 3-axis piezo-stage
11 Si chip with metal-semiconductor-metal waveguides and connected measuring electronics
12 Optical waveguide with lens, focal spot 5 µm
13 NIR laser source
14 Single-mode optical fiber
15 Polarization control

DETAILED DESCRIPTION

In particular, the present invention provides a method for producing a plasmonic component comprising a metal-semiconductor-metal contact in which a first metal layer is separated from a second metal layer, which is different than the first metal layer, by a semiconductor layer having a thickness of 100 nm or less, wherein the first metal layer is not in direct contact with the second metal layer. The method according to the invention comprises the following steps:

providing a semiconductor layer on a substrate;
providing an oxide layer at least partly on one of the surfaces of the semiconductor layer;
applying a structured resist layer at least partly on the opposite surface of the oxide layer relative to the semiconductor layer in such a way that regions with the resist layer and regions without resist layer arise and regions with the resist layer correspond to a basic form of the metal-semiconductor-metal contact;
removing the oxide layer and semiconductor layer in regions without resist layer to give rise to at least two surfaces of the semiconductor layer;
applying at least two layers each composed of different metals by angled vapor deposition on the surfaces of the semiconductor layer to form the metal-semiconductor-metal contact, wherein the first metal layer is not in direct contact with the second metal layer.

According to the present invention, the term "plasmonic component" is understood to mean a component which guides electromagnetic waves in the visible range (wavelengths in the range of 380 nm to 780 nm) or infrared range (wavelengths between 780 nm and 1 mm) of the spectrum in the form of a surface plasmon at a metal-semiconductor interface and, on account of internal photoemission, leads to a light-induced charge separation and hence a measurable current.

In one preferred embodiment of the present invention, the plasmonic component is present in the form of a plasmonic waveguide. Preferably, by means of the method according to the invention, a plasmonic waveguide comprising a metal-semiconductor-metal contact (also called metal-semiconductor-metal waveguide hereinafter) is produced in which a first electrode in the form of a first metal layer is separated from a second electrode in the form of a metal layer different than the first metal layer by a semiconductor layer having a thickness of less than 100 nm, wherein the first metal layer is not in direct contact with the second metal layer.

The method according to the invention comprises as a first step providing a semiconductor layer on a substrate, which is preferably present in the form of an insulating material. In particular, said semiconductor layer can be applied or deposited in a region of an insulating material in which the metal-semiconductor-metal contact or the metal-semiconductor-metal waveguide is also intended to be produced. Materials known to the person skilled in the art can be used as insulating material.

The semiconductor layer is provided in particular in the form of a planar coating. According to the invention, the semiconductor layer is present in the form of a solid and includes elemental semiconductors and compound semiconductors. Suitable materials are known to the person skilled in the art and can be selected depending on the desired purpose for use of the component according to the invention. Preferred elemental semiconductors consist of germanium, silicon or tin (α-tin). Suitable compound semiconductors comprise chemical compounds having on average four valance electrons, the resistivity of which is in the range of $10^{-4}$ Ω·m to $10^6$ Ω·m. These include compounds of elements of the $13^{th}$ and the $15^{th}$ main groups of the periodic table of the elements, such as, for example, gallium arsenide (GaAs) or indium antimonide (InSb), and of the $12^{th}$ subgroup and the $16^{th}$ main group, such as, for example, zinc selenide (ZnSe) or cadmium sulfide (CdS).

In accordance with one preferred embodiment, the semiconductor layer comprises germanium or silicon, wherein silicon is particularly preferred. In particular, the semiconductor layer can be provided in the form of a silicon layer that is applied or deposited on an insulating material, such as, for example, silicon dioxide ($SiO_2$).

The semiconductor layer preferably has a layer thickness of approximately 50 nm to approximately 2 μm, more preferably of approximately 100 nm to approximately 1 μm, and particularly preferably of 200 nm to 500 nm. In the present invention, the layer thickness of the semiconductor layer is understood as the perpendicular extent of the semiconductor layer relative to the contact area between substrate and semiconductor layer, which can also be designated as the height of the semiconductor layer (semiconductor layer height). The layer thicknesses can be determined by means of ellipsometry, for example. The layer thicknesses can typically be determined accurately to a few nanometers using this measurement method.

In a further step, an oxide layer is provided at least partly on one of the surfaces of the semiconductor layer. In particular, said oxide layer is provided at least partly on the opposite surface of the semiconductor layer relative to the substrate. This can be carried out by means of coating methods known in the prior art, wherein semiconductor oxide layers are preferably applied.

According to the invention, coating methods known in semiconductor technology can be used, wherein the oxide layer can be provided by oxidizing the surface of the semiconductor layer, on the one hand, and by applying a separate semiconductor oxide layer, on the other hand. The oxide layer is preferably provided by thermal oxidation of the semiconductor metal (in the case of an elemental semiconductor) or of the semiconductor alloy (in the case of a compound semiconductor). The coating process is based on a chemical reaction of oxygen with the semiconductor, wherein the possible coating processes can be classified substantially into dry and wet oxidation methods. In these coating processes, no oxide layer in the actual sense thereof, i.e. as a separate oxide layer, is applied since the oxygen reacts directly with the semiconductor layer, whereby part of the surface of the semiconductor layer is converted into an oxide layer. The oxygen is thus incorporated in a certain way into the semiconductor layer.

Dry oxidation methods are usually carried out at high temperatures, wherein the respective temperatures are dependent on the material of the semiconductor layer. By way of example, the thermal oxidation can be carried out at temperatures of 800 to 1200° C. by the semiconductor surface being exposed to an oxygen-containing atmosphere, such as, for example, pure oxygen or a mixture of oxygen and hydrogen.

A different method uses water vapor as oxidizing agent, which is also referred to as wet oxidation. For this purpose, a carrier gas, often oxygen or an oxygen-nitrogen mixture, flows through a so-called bubbler before coming into contact with the semiconductor layer, wherein the water molecules transported by the carrier gas subsequently react with the surface of the semiconductor layer. This oxidation reaction generally proceeds at temperatures of between 900° C. and 1100° C.

In this case, the achieved layer thickness of the oxide layer is dependent on the temperature and the oxidation time. Preferably, the layer thickness of the oxide layer is set in such a way that it is 10 to 50%, more preferably 15 to 40%, particularly preferably 20 to 30%, of the thickness of the semiconductor layer. For reasons of stability, however, the layer thickness of the oxide layer is at least 50 nm, independently of the semiconductor layer height.

According to the invention, dopants can be introduced in the semiconductor layer, said dopants supporting the formation of the oxide layer. In addition, the surface of the semiconductor layer can be cleaned, if appropriate, before oxidation, wherein metallic contaminants, in particular, are intended to be reduced. One typical cleaning process is RCA cleaning, which uses hydrogen chloride (HCL) for binding metallic contaminants. However, it is also possible to use other cleaning processes using other compounds, such as, for example, organic chlorine compounds, such as e.g. 1,2-dichloroethene.

As described above, providing the oxide layer can also be carried out by applying a separate semiconductor oxide layer. This is advantageous in particular if the given semiconductor layer height ought not to be impaired by the oxidation. In this case, a corresponding oxide layer can be applied by deposition methods known in the prior art. By way of example, TEOS deposition and silane pyrolysis may be mentioned as non-limiting deposition methods.

If the oxide layer is deposited in the form of a separate layer, the layer thickness of the oxide layer is preferably approximately 10 nm to approximately 1 μm, more preferably from approximately 30 nm to approximately 500 nm, and particularly preferably from 50 nm to 200 nm.

After the oxide layer has been provided on the semiconductor layer, according to the invention a structured resist layer is applied at least partly on the opposite surface of the oxide layer relative to the semiconductor layer, as a result of which regions with the resist layer and regions without resist layer arise. This is carried out in such a way that regions with the resist layer correspond to a basic form of the metal-semiconductor-metal waveguide to be produced.

According to the present invention, the term "a structured resist layer" is also understood to mean a structured mask layer which protects the underlying oxide layer in subsequent method steps, in particular in etching steps. The structured resist layer can be applied by methods known in the prior art.

By way of example, this can be done in the context of a lithography method. The resist layer used can be a photoresist or negative resist, for example, which in the liquid state, for example, is applied on the surface of the oxide layer by spin coating, spraying or spreading. On the other hand, the resist layer in the solid state can also be applied, in particular adhesively bonded, on the surface of the oxide layer.

In general, for this purpose it is possible to provide irradiation-sensitive materials (resist material), for example polymerizable material, in an untreated, i.e. non-polymerized, state on the surface of the oxide layer, in particular at least in the region in which the metal-semiconductor-metal waveguide to be produced is also formed.

As described above, positive resists and also negative resists can be used according to the invention. In the case of a positive resist, the regions which are subjected to a treatment, such as e.g. exposure, are made soluble for a development solution subsequently used, as a result of which the non-treated regions correspond to the structured resist layer on the oxide layer. In the case of a negative resist, by contrast, treated locations become resistant for the further steps and remain as structured resist layer in the form of a protective passivation layer on the surface of the oxide layer.

The above materials for forming a resist layer are sufficiently known to the person skilled in the art and can be selected depending on the corresponding materials of the semiconductor layer and oxide layer. As non-limiting examples of photoresists, mention may be made of resists containing, as light-sensitive component, diazo compounds, such as e.g. diazonaphthoquinone or naphthoquinone diazide, and corresponding resins or polymers, such as e.g. polymethyl methacrylate (PMMA), novolacs or epoxy resins.

In the case of a negative resist, mention may be made of, for example, long-chain hydrogen silsesquioxane (HSQ), calixarenes or compounds comprising partially cyclized polyisoprene. The materials additionally contain a suitable film-forming agent, e.g. phenolic resin compounds. Further possible additives in the resist layer are, inter alia, stabilizers and/or inhibitors.

After the resist material has been treated in a first irradiation step, the resist layer is subjected to a subsequent development step, as a result of which, depending on the material used, either the treated regions or the untreated regions of the resist material are removed. The development solution is specific to each resist used.

As described above, a structured resist layer is produced on the oxide layer with the aid of the lithography method. Preferably, the resist layer is structured by means of electron, ion beam or laser lithography. Particularly preferably, the resist layer is structured by means of electron beam lithography. As non-limiting, concrete examples, mention may be made of Vistec V6 as an electron beam writer and, as an example of laser lithography, the DWL 2000 system from Heidelberg Instruments, which uses a UV laser.

In order to improve the adhesion properties of the resist layer on the oxide layer, before the resist layer is applied, an additional adhesion promoting layer, for example on the basis of hexamethyldisilazane (HMDS), can be applied on the oxide layer (e.g. Ti-prime, MicroChemicals GmbH, D-89077 Ulm).

After the structured resist layer has been applied on the oxide layer, according to the invention the oxide layer and semiconductor layer are removed in regions without resist layer, wherein at least two surfaces of the semiconductor layer arise. In particular, this method step involves uncovering at least two surfaces of the semiconductor layer by etching away the abovementioned regions of the oxide layer and semiconductor layer. This can be done in one process step, for example, but also in separate successive process steps.

By way of example, in a first etching step the oxide layer can be removed in regions without resist layer, and in a subsequent second etching step the semiconductor layer can be removed, in each case under suitable conditions. Dry etching methods, in particular, are suitable for this purpose. Said dry etching methods include physical dry etching methods, chemical dry etching methods and physico-chemical dry etching methods.

In the physical dry etching methods, the material removal is carried out by bombardment with ions, electrons or else photons, the material removal usually being carried out in vacuo.

The chemical dry etching methods are based on a chemical reaction of a usually plasma-activated gas, wherein gaseous reaction products that form, such as e.g. $SiF_4$, are generally extracted via a vacuum pump.

The physico-chemical dry etching methods, based on the combination of the methods mentioned above, include reactive ion etching (RIE), deep reactive ion etching (DRIE), reactive ion beam etching and HDP etching (high-density plasma etching).

Preferably, the method according to the invention involves removing the oxide layer and/or semiconductor layer in regions without resist layer by means of a physico-chemical dry etching method, wherein for example trifluoromethane ($CHF_3$), sulfur hexafluoride ($SF_6$), hydrogen bromide (HBr) and/or oxygen can be used as reactive gas (etching gas), without being restricted thereto. The etching gas is selected depending on the material to be etched. In the case of silicon, $SiO_2$ or silicon nitride, for example, etching gases containing fluorine or chlorine are preferably used. In the case of organic materials, by way of example, oxygen is used as etching gas. The etching is preferably carried out by means of charged particles (ions) that were generated in a gas plasma.

In particular, the method according to the invention preferably involves using RIE etching, which enables an isotropic, i.e. direction-independent, etch and also an anisotropic etch.

As described above, the step of removing the oxide layer and semiconductor layer can be carried out in a single etching step or in separate successive process steps. In accordance with one preferred embodiment, firstly anisotropic RIE etching is carried out, wherein the oxide layer and semiconductor layer are removed successively in regions without resist layer, as a result of which the at least two surfaces of the semiconductor layer are uncovered. The uncovered structure substantially corresponds to the basic form (contour) of the metal-semiconductor-metal contact or waveguide to be produced. It is thereby possible to obtain for example a rectangular or square cross section of the metal-semiconductor-metal waveguide to be produced.

According to the invention, the metal-semiconductor-metal waveguide is present in particular virtually in trapezium-shaped or rectangular fashion, wherein a form in which the semiconductor layer is narrower on the side facing the substrate than on the side facing the oxide layer is preferred. It is also possible for the metal-semiconductor-metal waveguide according to the invention to have a trapezoid-like cross section with rounded flanks (sides). Furthermore, the contour of the metal-semiconductor-metal waveguide may preferably be such that in cross section the semiconductor layer tapers in a trapezoid-like fashion proceeding from the substrate side to the oxide layer, wherein the lateral surfaces of the semiconductor layer (the at least two resultant surfaces of the semiconductor layer) are rounded for example in the form of a concave curvature. Particularly preferably, the lateral surfaces of the semiconductor layer are embodied elliptically in the form of a concave curvature, as is illustrated schematically in FIG. 1.

These forms can be obtained for example by lateral undercutting being carried out in further isotropic etching, in particular by means of RIE etching. Preferably, the contour of the metal-semiconductor-metal waveguide is thereby produced in cross section. In this case, it is possible for corresponding regions to be masked in a further lithography step upstream of this isotropic etching step, in particular by means of electron or ion beam lithography.

However, the metal-semiconductor-metal waveguide is not restricted to the above forms. All that is crucial for the contour of the metal-semiconductor-metal waveguide is the undercutting of the oxide mask, as a result of which a short circuit can be prevented, and the thickness of the semiconductor layer d, which defines the waveguide. The production goal is, inter alia, an extremely narrow dielectric layer between two different metals. This necessitates an undercut mask, for example, which is fixedly connected to the substrate to be coated. The mask serves for shading during the angled vapor deposition. The metals can thus be applied selectively with the aid of an undercut oxide mask.

As described above, the thickness d of the semiconductor layer (reference sign 2 in FIG. 1) that separates the metal layers described below is 100 nm or less. According to the invention, the thickness of the semiconductor layer is considered to be the minimum thickness d, which, in the case of a trapezoidal contour, can be less than the thickness $d_B$ of the semiconductor layer on the substrate side. The thickness d of the semiconductor layer can be configured to be as small as desired according to the invention. This constitutes a considerable advantage of the method according to the invention since the thickness (cross-sectional thickness) of the metal-semiconductor-metal waveguide can be configured to be as small as desired, without producing a short circuit.

Preferably, the thickness d of the semiconductor layer is 10 nm to 90 nm, more preferably 20 nm to 80 nm, and particularly preferably 30 to 70 nm.

According to the invention, after the step of removing the oxide layer and semiconductor layer in regions without resist layer, the component to be produced has a semiconductor layer having at least two (lateral) surfaces and an oxide layer (reference sign 1 in FIG. 1) that remained thereon, i.e. on the opposite surface relative to the substrate side, with a desired contour. If appropriate, the structured resist layer can furthermore be arranged additionally on the oxide layer (not shown in FIG. 1). However, the structured resist layer is usually removed in the context of the etching methods described above.

Figure 2:
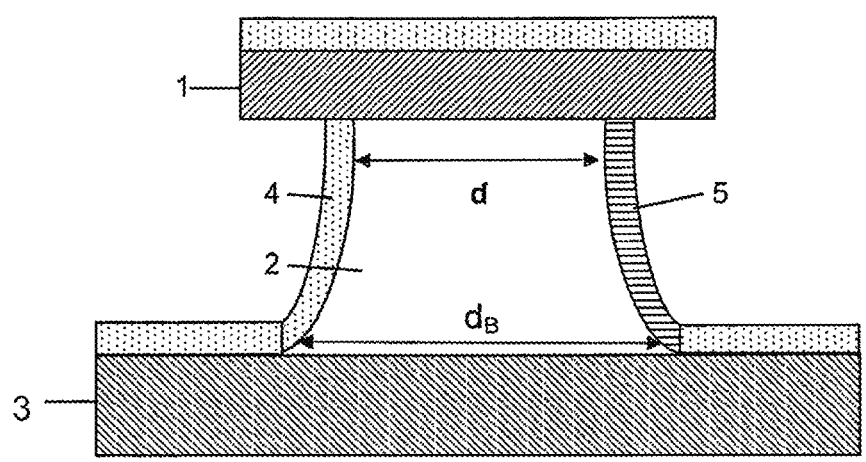
FIG. 2: shows a schematic illustration in cross section of a metal-semiconductor-metal contact in accordance with one preferred embodiment of the present invention.

After the basic form or contour of the metal-semiconductor-metal waveguide has been formed, at least two layers each composed of different metals are applied by angled vapor deposition on the surfaces of the semiconductor layer to form the metal-semiconductor-metal waveguide. According to the invention, said metal layers are applied in such a way that the first metal layer is not in direct contact with the second metal layer, as a result of which a short circuit can be avoided. The separation of said metal layers or the avoidance of a short circuit during the vapor deposition step is made possible by the oxide layer that remained, as is illustrated schematically in FIG. 2. Accordingly, a first metal layer (reference sign 4 in FIG. 2) is applied at least on a surface of the semiconductor layer. A second metal layer (reference sign 5 in FIG. 2), which is different than the first metal layer, is applied at least on a further surface of the semiconductor layer.

Preferably, the first metal layer (4) is applied at least on a first surface of the semiconductor layer and the second metal layer (5) is applied on the surface of the semiconductor layer situated opposite the first surface. As illustrated schematically in FIG. 2, the first metal layer (4) and/or the second metal layer (5) can additionally be applied on the substrate (reference sign 3 in FIG. 2) and/or on the oxide layer, if appropriate on the resist layer present.

Applying the at least two layers each composed of different metals is carried out by angled vapor deposition according to the invention. This is preferably done in successive vapor deposition steps (metallization steps). The vapor depositions for coating the semiconductor sidewalls are carried out at angles of greater than 45° and less than −45° with respect to the surface normal of the substrate. Further, if appropriate angled, vapor depositions define the externally contactable electrodes and bring about an electrical contact between the materials applied on the sidewalls and the contact electrodes.

According to the invention, different metal layers are thereby applied on the two surfaces of the semiconductor layer, wherein the respective layer thicknesses of the metal layers are preferably in the subnanometer range through to the range of a few nanometers. Preferably, the respective layer thicknesses of the metal layers are 0.1 nm to 80 nm, more preferably 10 nm to 60 nm, particularly preferably nm to 50 nm. In order to determine the layer thicknesses it is possible to use corresponding measuring devices during the vapor deposition, for example quartz oscillators. A further possibility for determining the layer thicknesses is by breaking ("dicing") an exemplary sample and measuring the laterally attached metal layers by means of scanning electron microscopy. In this case, the laterally applied metal layers may be of the same or different layer thicknesses.

The different metal layers are not restricted in a particular way and can be selected depending on the desired purpose for use of the component according to the invention. This constitutes a considerable advantage of the method according to the invention since active and passive plasmonic components can be produced from any desired materials that can be applied by vapor deposition. In this regard, instead of metals, firstly nonlinear electro-optical materials or laser media can be applied, which can then interact both with an external electric field and with a coupled-in light field as a result of metallization steps as described above. In this regard, electro-optical modulators or plasmonic amplifiers and laser sources can be realized, inter alia. The electrodes which are not directly in contact ensure, by virtue of their small distance, a strong electric field even at relatively low voltages, such that the efficiency of light-matter interactions which are dependent on the field strength can be increased.

In the case of the application of the metal-semiconductor-metal waveguide as a photodetector, for reasons of quantum efficiency it is preferred for the metal layers to be selected in such a way that electromagnetic waves are predominantly absorbed in one metal layer, whereas the second metal layer acts in particular as a counterelectrode that guides the electromagnetic waves. As illustrated schematically in FIG. 3, in the plasmonic component according to the invention, a surface plasmon, represented as amplitude profile, is guided in the metal-semiconductor-metal waveguide.

Preferably, the two metal layers each contain different metals, i.e. each metal layer contains at least one metal which is different than at least one metal of the other layer.

Preferably, the first metal layer consists of a metal of the $11^{th}$ subgroup of the periodic table of the elements or aluminum and alloys thereof. That is to say that the first metal layer preferably consists of a metal selected from the group consisting of gold, silver and aluminum and alloys thereof. Gold and silver are particularly preferred.

Independently thereof, in accordance with a further preferred embodiment, the second metal layer consists of a metal of the $4^{th}$ and $10^{th}$ subgroups and the metals of the $14^{th}$ and $15^{th}$ main groups of the periodic table of the elements and alloys thereof. Furthermore, the second metal layer can contain copper. Preference is given in particular to metals consisting of titanium, chromium, zirconium, nickel, palladium, platinum, tin, lead, bismuth and copper and alloys thereof. Titanium, copper and chromium and alloys thereof are particularly preferred as the second metal layer.

For reasons of quantum efficiency it is particularly preferred for the metal layers to be selected in such a way that the metal of the second metal layer exhibiting high absorption has a low potential barrier with respect to the semiconductor layer.

In one particularly preferred embodiment of the present invention, the first metal layer consists of gold and the second metal layer consists of titanium.

As described above, light having the energy $\hbar \omega$ that does not suffice to generate direct band-band transitions in the semiconductor can be guided in the form of a surface plasmon in these waveguides. Individual electrons in the metal undergo transition to a higher energy state as a result of absorption (so-called "hot electrons"). This increases the probability of these high-energy electrons overcoming the potential barrier between semiconductor and metal, which leads to a light-induced charge separation and hence a measurable current.

A voltage applied across the junction then brings about, depending on the polarity, either support or counteracting of the current flow across this barrier. Such a junction therefore exhibits the behavior of a photodetector since the current flow is prevented in one direction.

Therefore, further subject matter of the present invention relates to a method for producing a plasmonic photodetector using the method according to the invention for producing the plasmonic component, wherein the plasmonic component is coupled to a voltage to be applied. In this case, the plasmonic component can also be designated as an active plasmonic component.

Preferably, the plasmonic component according to the invention is directly coupled to a photonic silicon waveguide.

The method according to the invention can comprise further steps, if appropriate. By way of example, in one additional step the substrate described above can be detached from the metal-semiconductor-metal contact, such that the plasmonic component, in particular the waveguide, is present as a freeform structure. Said freeform structure can be used for example as an "SNOM" tip that can resolve the so-called near field of an optical component. In this case, light capture and detection can take place at the same location.

Furthermore, in the method according to the invention, further coatings can be applied on the metal-semiconductor-metal contact. As a result, it is possible for the plasmonic component according to the invention to be functionalized as amplifier, electro-optical transducer or phase shifter. The uncovered sides of the semiconductor structure make it possible, in principle, to apply further arbitrary materials which can be vapor-deposited, such as, for example, insulators or other semiconductors. On these deposited materials, metals can in turn be deposited by angled vapor depositions and thus form an electrically contactable plasmonic waveguide.

The layer sequence metal (1)-oxide-semiconductor-metal (2) can give rise to an absorption modulator, for example: applying a negative voltage to metal (2) brings about an increase in the charge carrier density (electrons) in the semiconductor. These free charge carriers increase the absorption of the surface plasmon (free-carrier absorption) that is guided in the plasmonic waveguide. The intensity of the emerging light can accordingly be modulated by the modulation of the applied voltage.

Moreover, protective layers can be deposited, if appropriate, whereby the plasmonic component is protected in particular against subsequent undesired mechanical and/or chemical influences.

The method according to the invention yields a plasmonic component comprising a metal-semiconductor-metal contact or metal-semiconductor-metal waveguide in which a first metal layer is separated from a second metal layer, which is different than the first metal layer, by a semiconductor layer having a thickness of less than 100 nm, wherein the first metal layer is not in direct contact with the second metal layer.

According to the invention, the plasmonic component preferably furthermore has an oxide layer that separates the first metal layer from the second metal layer. A possible short circuit between the metal layers or the electrodes can be avoided as a result. As described above, the metal-semiconductor-metal waveguide of the plasmonic component according to the invention preferably has a trapezoid-like cross section with, for example, rounded flanks (sides).

In a further embodiment, the plasmonic component can furthermore comprise a substrate on which the metal-semiconductor-metal contact is arranged. According to the invention, the contour of the metal-semiconductor-metal contact, in particular of the waveguide, is preferably such that in cross section the metal-semiconductor-metal contact tapers in a trapezoid-like fashion proceeding from the substrate side to the oxide layer, wherein the lateral metal layers are rounded, preferably in the form of a concave curvature. Particularly preferably, the lateral surfaces of the metal layers are embodied elliptically in the form of a concave curvature, as is illustrated schematically in FIG. 2.

However, it is not absolutely necessary for the metal-semiconductor-metal contact to be arranged on a substrate. As described above, the plasmonic component according to the invention, in particular the waveguide, can be present as a freeform structure, i.e. in a free-standing fashion.

The thickness (total thickness) of the metal-semiconductor-metal contact or of the waveguide is not restricted in a particular way. Depending on the respective layer thicknesses of the metal layers, the total thickness can be 200 nm or less, more preferably 160 nm or less, particularly preferably 120 nm or less. The (total) thickness of the metal-semiconductor-metal contact or of the waveguide is considered to be the minimum thickness of the metal-semiconductor-metal contact, in a manner analogous to the above-described thickness d of the semiconductor layer.

The height of the metal-semiconductor-metal contact or of the waveguide is not restricted in a particular way. However, since the dark current rises with the area of the contact, the latter should be as small as possible. By way of example, the height of the metal-semiconductor-metal contact or of the waveguide can be approximately 50 nm to 1 µm, preferably approximately 100 to 500 nm, particularly preferably approximately 200 to 340 nm.

Figure 3:
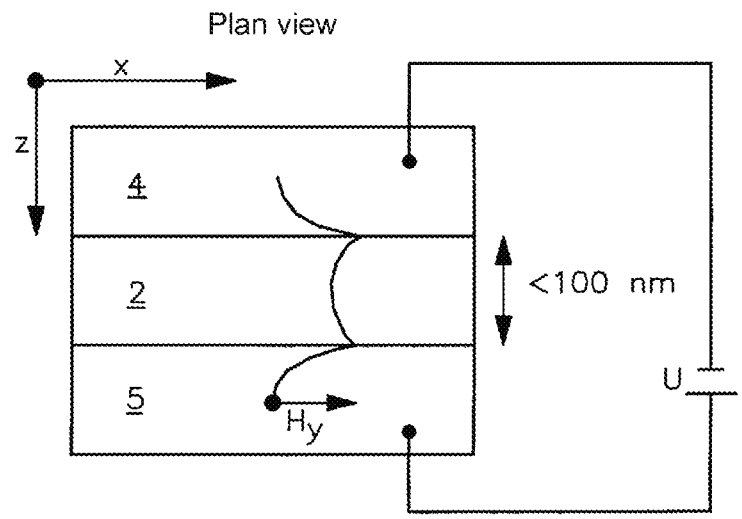
FIG. 3: shows a simplified schematic illustration (view from above) of a metal-semiconductor-metal contact according to the invention, wherein the amplitude profile shows the profile of the magnetic field of the guided mode.
Figure 4:
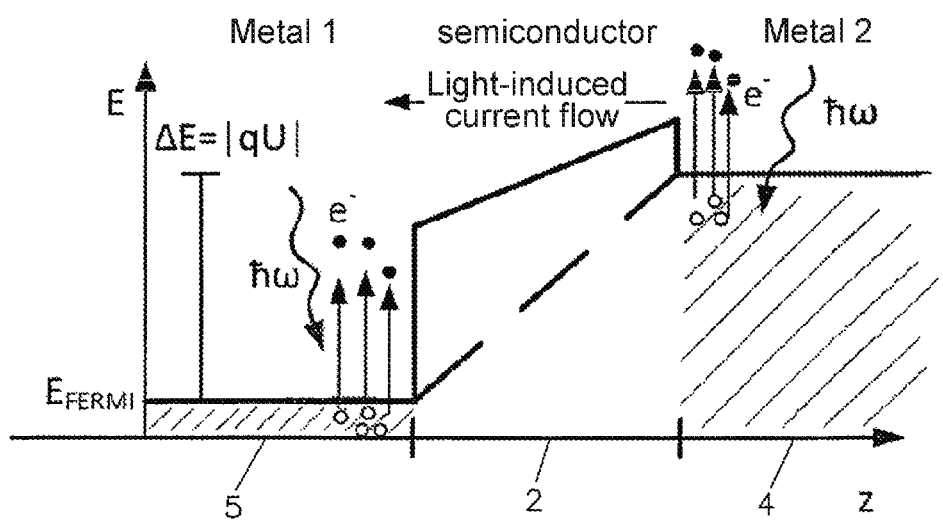
FIG. 4: shows a simplified schematic cross-sectional illustration of an asymmetrical metal-semiconductor-metal contact with light-induced charge separation for clarifying internal photoemission, which leads to a measurable current when voltage is applied.

The length of the metal-semiconductor-metal contact or of the waveguide, i.e. the extent in the x-direction, as shown in FIG. 3, is preferably 100 µm or less, more preferably 50 µm or less, particularly preferably 20 µm or less. In accordance with a particularly preferred embodiment, the length of the metal-semiconductor-metal contact or of the waveguide is 10 µm or less. In all embodiments, the minimum length is preferably 0.5 µm.

As described above, the plasmonic component according to the invention is suitable on the basis of internal photoemission in particular for photodetection.

Further subject matter of the present invention therefore relates to a plasmonic photodetector comprising a plasmonic component comprising a metal-semiconductor-metal contact in which a first electrode in the form of a first metal layer is separated from a second electrode in the form of a metal layer different than the first metal layer by a semiconductor layer having a thickness of less than 100 nm, wherein the first metal layer is not in direct contact with the second metal layer. Said metal layers are used for photodetection and simultaneously as electrodes for connection to an external electrical circuit.

As described above, it is preferred for the metal layers to be selected in such a way that electromagnetic waves are predominantly absorbed in one metal layer, which constitutes the photoactive electrode, whereas the second metal layer preferably constitutes the counterelectrode.

Preferably, in the plasmonic photodetector according to the invention, the plasmonic component is directly coupled to a photonic silicon waveguide. The circumstance that light guided in the photonic waveguide can be focused to a few tens of nanometers in the plasmonic waveguide leads to high quantum efficiencies, large bandwidths and short device lengths in the range of a few micrometers.

The plasmonic photodetector according to the invention enables the detection of electromagnetic waves in the visible range (wavelengths in the range of 380 nm to 780 nm) and infrared range (wavelengths between 780 nm and 1 mm) of the spectrum. Therefore, the plasmonic photodetector according to the invention can be used both in highly integrated optical communications technology in the infrared range (IR range) and in photodetection in the visible range.

Preferably, the plasmonic photodetector according to the invention is used in photovoltaics.

The plasmonic photodetector according to the invention is distinguished by high quantum efficiencies that are significantly increased in comparison with known systems in the prior art for light detection on the basis of internal photoemission. In particular, the plasmonic photodetector according to the invention has a quantum efficiency of at least 2%. Preferably, the quantum efficiency of the plasmonic photodetector is in the range of 5 to 50%, particularly preferably 10 to 30%. In this context, it should be pointed out that the quantum efficiency is dependent on the wavelength, higher efficiencies arising for shorter wavelengths. The quantum efficiency can be obtained for example by comparison with a reference diode for which the responsivity is known.

In addition, the plasmonic photodetector according to the invention is distinguished by an improved electrical bandwidth. In particular, the plasmonic photodetector according to the invention preferably has an electrical bandwidth of more than 100 GHz.

As described above, methods for producing plasmonic components known in the prior art have various disadvantages. Owing to technological limitations, it is primarily difficult to construct in a controlled manner multilayered plasmonic structures consisting of different materials (metals and insulators/semiconductors) without a short circuit of the electrodes, which are at a distance of only 100 nm from one another.

The present invention makes it possible to provide ultra-compact plasmonic components, in particular in the form of waveguides, and plasmonic photodetectors of high quality with an increased quantum efficiency and an improved electrical bandwidth which allow a higher integration density in comparison with conventional photodiodes. Furthermore, the present invention is distinguished by the fact that a short circuit between the metal layers, which can also be used as electrodes, is avoided despite the compact dimensions of the plasmonic component.

As described above, an increase in the quantum efficiency of the internal photoemission (overcoming a potential barrier with electrons either ballistically or by means of the tunnel effect) is achieved by virtue of the differing metals of the metal layers preferably being selected in such a way that the potential barriers and the absorption at the location of photoemission are optimized.

Plasmonic components are known from the prior art, but the electrodes were all produced from the same metal. For the components according to the invention, however, two different metals are required for the electrodes in order to comprehensively achieve the object on the basis of the described effects, in particular tunneling. The choice of the metals is preferably such that the charge carriers capable of tunneling are generated in only one metal and this metal simultaneously has the lower work function with respect to the semiconductor, crucial for efficient utilization of the tunnel effect and thus for the function of the component according to the invention.

Although the prior art mentions the tunnel effect, it does so in a general way and without a concrete reference to the abovementioned different metals and the optical and electronic properties thereof. Only components which use a potential gradient are disclosed in the prior art, while the use of the tunnel effect with separated charge carriers is used in the context of the application. Moreover, the prior art describes a solution for achieving the potential differences, which is solved according to the invention precisely by means of different metals for adjacent electrodes.

Furthermore, as production methods, engraving methods are known from the prior art, which differ in principle from the method according to the invention. Even if an effective gap also of less than 50 nm is described in the prior art, it would not be producible, in principle, by engraving.

Simulation of Optical Properties of Metal-Semiconductor-Metal Contacts

Figure 5:
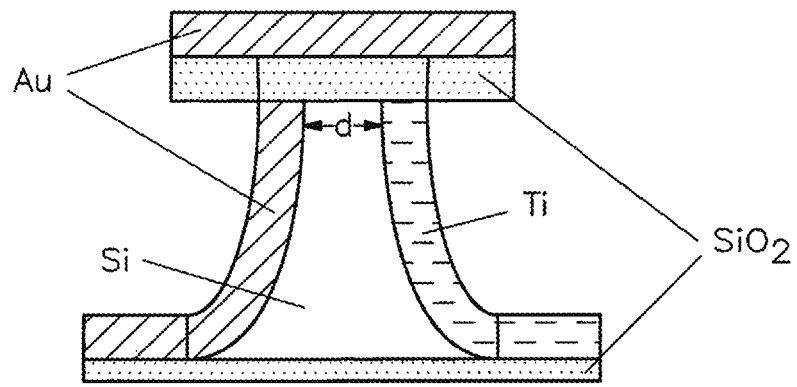
FIG. 5: shows a schematic illustration in cross section of a metal-semiconductor-metal contact in accordance with one particularly preferred embodiment of the present invention.

Reference is made below to the metal-semiconductor-metal contact in the form of a waveguide as illustrated in FIG. 5. This consists of a silicon nanowire having elliptical sidewalls, wherein its base surface is wider in cross section than at the upper end. A gold layer is deposited on the left surface of the waveguide, and a titanium layer on the right surface of the waveguide. The waveguide geometry corresponds to waveguides actually produced, as will be described below.

The optical properties of the waveguide were simulated with the aid of COMSOL (Comsol 4.3a Simulation Module: Electro-magnetic waves, frequency domain), wherein the electric field distribution (fundamental guided mode) and the absorption characteristics were examined in each case depending on the thickness d of the waveguide. These simulations were carried out at an optical wavelength of 1270 nm.

Figure 6:
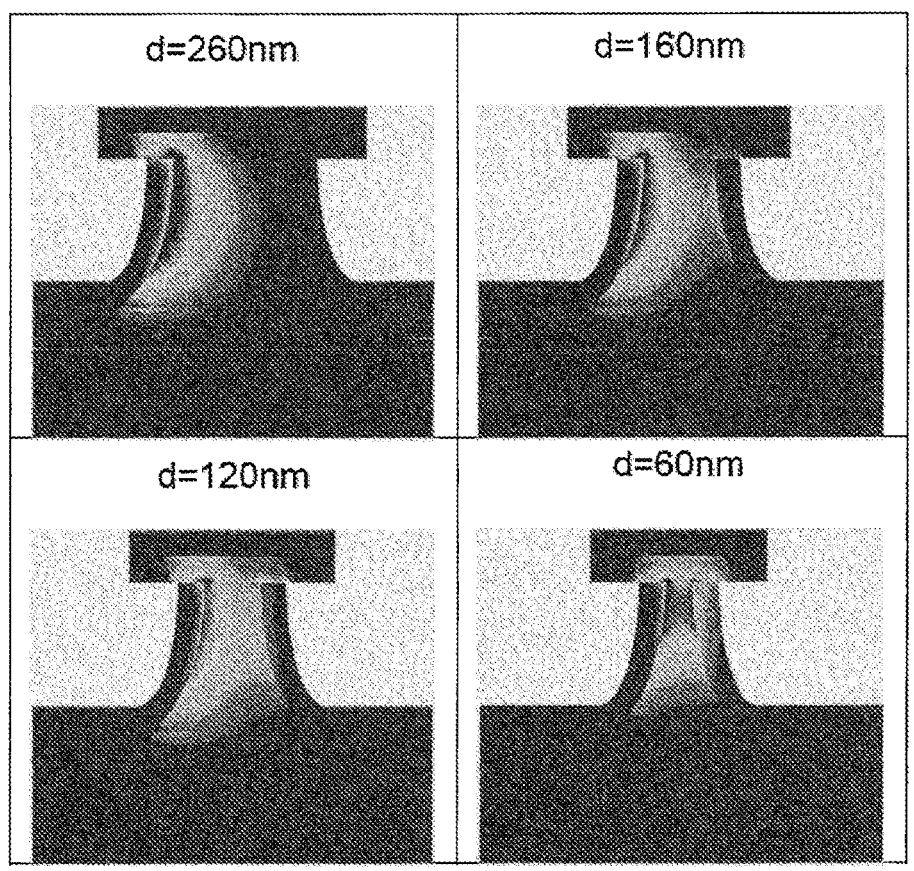
FIG. 6: shows simulated standards of the electric field depending on the thickness d.

It is evident with reference to FIG. 6 that the electric field of the respective waveguide is all the more constricted, the narrower the waveguide. Furthermore, it is found that the penetration depth of the field toward the right-hand side with the titanium layer increases as the thickness d decreases. Since titanium effects much greater absorption in comparison with gold at the wavelength chosen, the proportion of light absorbed in the titanium also increases as the thickness d decreases.

Figure 7A:
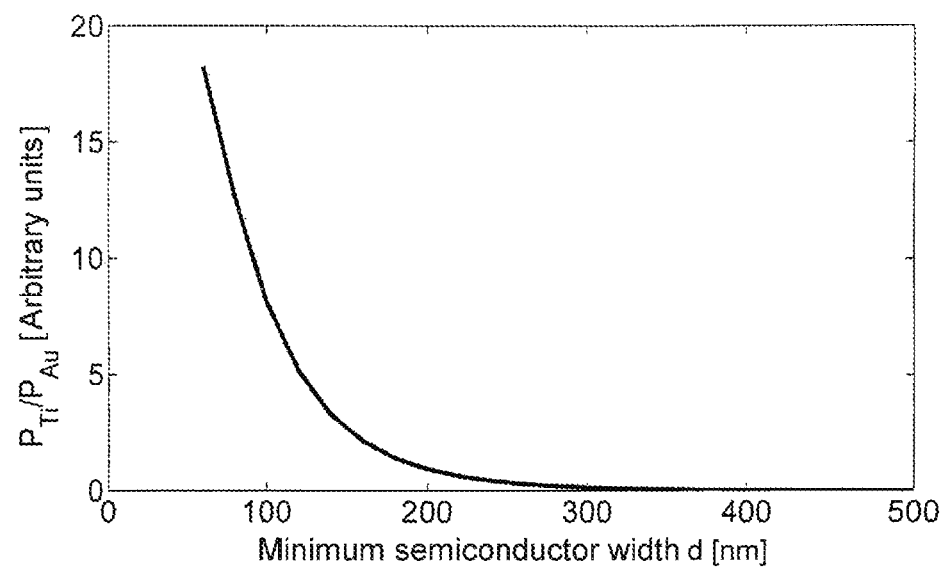
FIG. 7A: shows the ratio of the power losses in titanium and gold electrodes.
Figure 7B:
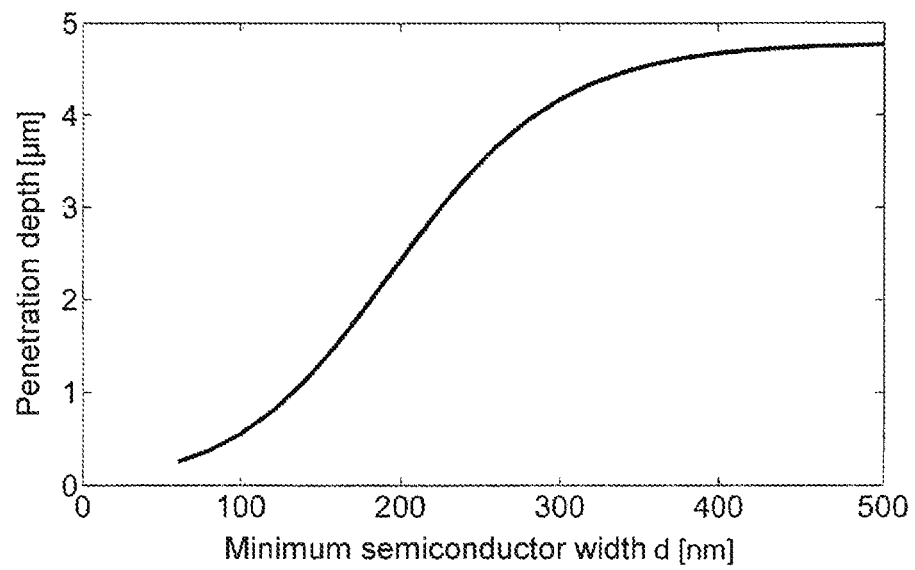
FIG. 7B: shows the penetration depth, i.e. the absorption length, i.e. the length after which the intensity of the optical signal has fallen to 1/e on account of absorption.

In order to determine the density of the power losses in the electrodes which generate the photoinduced charge carriers, the power losses in each electrode were numerically integrated. FIG. 7(A) shows the ratio of the power losses in titanium and gold. As d decreases, the proportion of the power loss in titanium increases nonlinearly. For a waveguide having a width of 100 nm, the photogeneration in titanium exceeds that in gold by a factor of 10. The increased loss in the titanium electrode is accompanied by a reduced penetration depth into the waveguide, as can be seen in FIG. 7(B).

For waveguides having a width of less than 100 nm, a large portion of the power loss occurs solely at the titanium electrode, while a short penetration depth is made possible by small component lengths of less than 5 µm.

Production of Photoactive Plasmonic Waveguides

Figure 8:
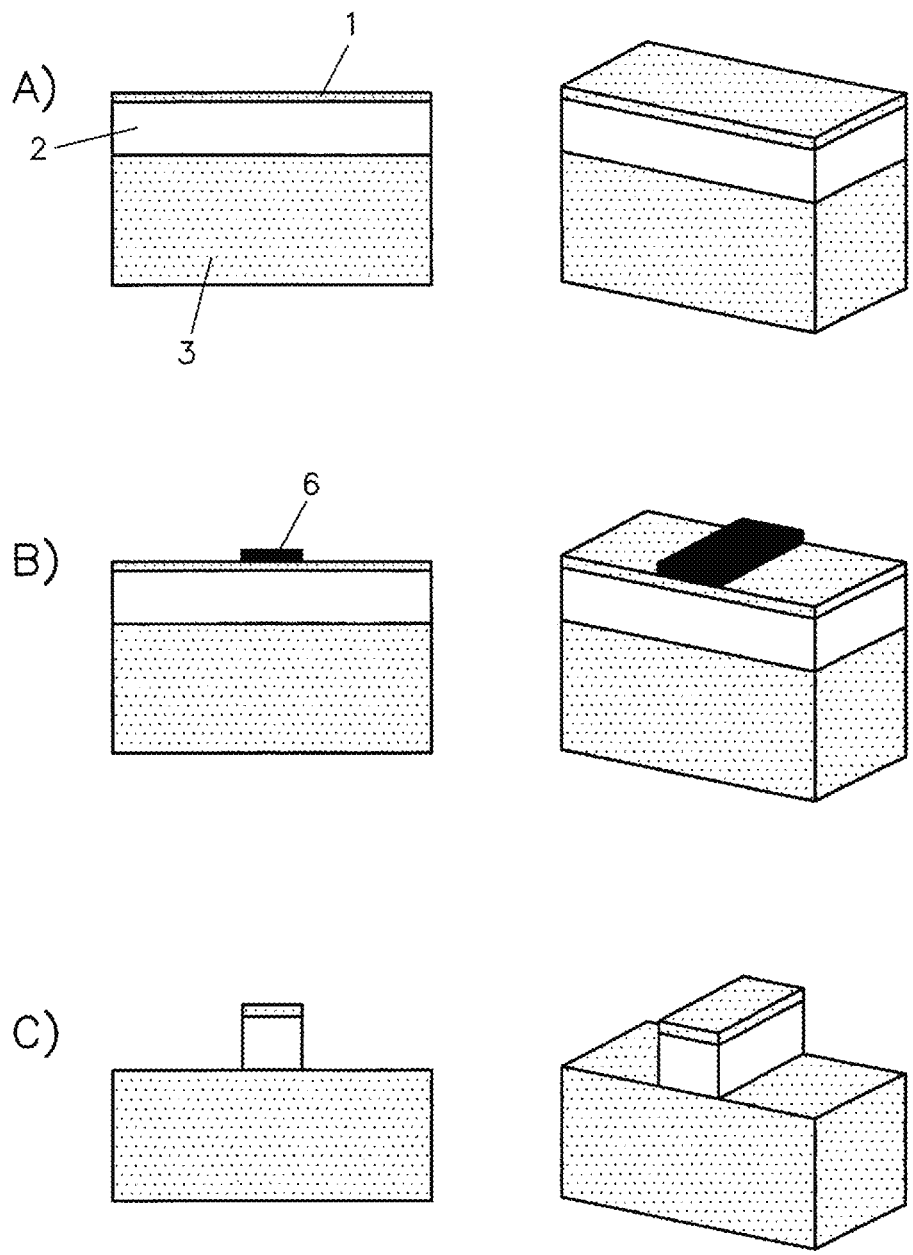
FIG. 8: shows schematic method steps (Parts A E) of the method according to the invention.
Figure 8:
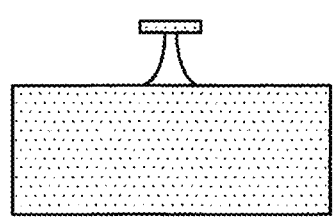
Figure 8:
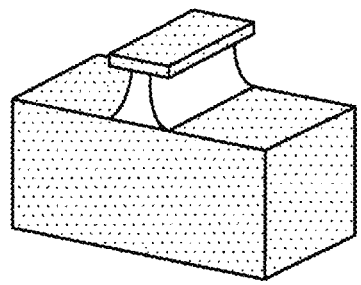
Figure 8:
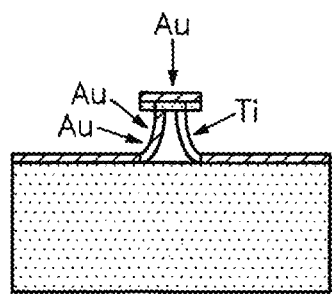
Figure 8:
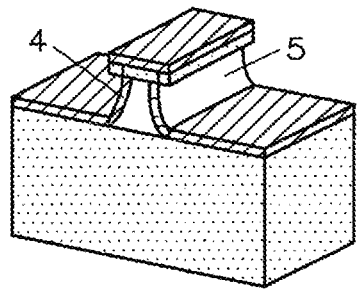

Photoactive plasmonic waveguides on SOI (silicon on insulator) wafers with gold and titanium as electrode materials and an electrode spacing of less than 100 nm were produced as follows (also cf. FIG. 8).

SOI wafers having component thicknesses of 340 nm were thermally oxidized until an 80 nm thick oxide layer formed on the surface of the silicon. This was carried out at a temperature of 1040° C. in a dry oxygen atmosphere (>99%) at 1 bar. Silicon was consumed during this process, leaving behind an approximately 300 nm thick silicon layer (cf. FIG. 8, part A).

Negative resist maN-2401 (from Micro Resist Technology GmbH, Berlin) was spin-coated onto the surface of the oxidized wafer. Using electron beam lithography, the contour of the waveguides, of markers and coupling regions was written into the resist, the resist protecting the oxide layer in the subsequent etching steps (cf. FIG. 8, part B).

$CHF_3$ was used to remove the unprotected regions of the oxide layer. By means of the cryo process using $SF_6$ (temperature: −115° C., pressure: 5 mtorr, gas flow rates: 36 sccm $SF_6$, 18 sccm $O_2$, 10 sccm Ar, RF power: 20 W, ICP power: 700 W), the waveguides were anisotropically etched into the silicon. In this case, the oxide layer on the surface functions as a mask during etching with $SF_6$ (cf. FIG. 8, part C).

A second electron beam lithography method was carried out in order to protect the photonic parts in the next etching step and in order to define the electrode form. Afterward, the silicon waveguide was laterally undercut in a further isotropic etching step at room temperature using $SF_6$ (cf. FIG. 8, part D).

It is important here that in the processing also firstly the undercut regions and the electrodes can be produced and afterward the feeding silicon waveguides can be produced anisotropically using $SF_6$ or HBr. The order of the structuring of the plasmonic and purely photonic components can thus be interchanged.

An asymmetrical plasmonic waveguide having different metal layers, including gold electrodes, on each side was produced in a total number of five metallization steps at the angles. In this case, the oxide mask (oxide layer) prevents the two sides from short-circuiting one another during deposition. In the first two vapor depositions (metallization steps), titanium and gold were respectively applied on the sidewalls of the undercut silicon at an angle of from 70° to 85° with respect to the surface normal. That part of the detector which interacts with light is thus defined (cf. FIG. 8, part E).

The last vapor deposition at 0° defines the electrodes at which the external electronics tap off the photocurrent. Said electrodes are usually composed of gold or aluminum or an alloy of titanium and aluminum, in order to ensure the best possible electrical contact between the conductors on the chip and the electronics, wherein the deposited metal layer may be 100 nm, for example.

The vapor deposition steps in between at an angle of approximately 45° provide for a good electrical contact of the plasmonic region at the waveguide and the electrodes. The material used for these steps can be the same as that also used for depositing the electrodes. The first two steps with different metals are thus crucial for photodetection. All further steps provide for a good electrical contact toward the outside and can be realized with arbitrary conductive materials.

Figure 9:
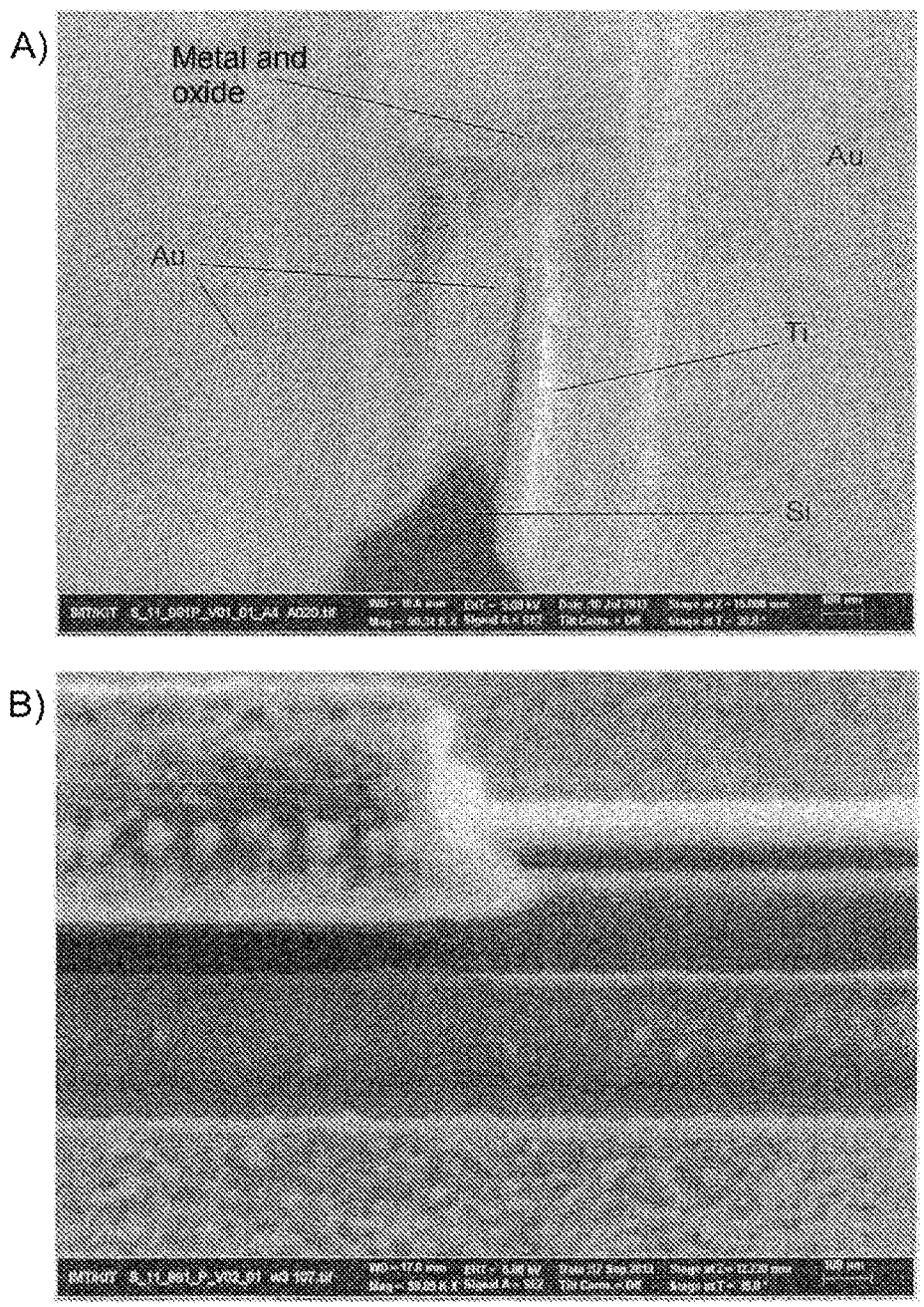
FIG. 9A: shows scanning electron microscope micrograph of a waveguide structure in accordance with one particularly preferred embodiment of the present invention.
FIG. 9B: shows scanning electron microscope micrograph of a side view of the waveguide structure in accordance with one particularly preferred embodiment of the present invention.

Plasmonic waveguides having lengths of more than 10 mm were produced on the substrate. The substrate was then scribed and broken using a diamond cutter, thus giving rise to a fracture edge perpendicular to the longitudinal direction of the waveguides. Said fracture edge uncovers the facet and thus the cross section of the waveguide. FIG. 9 shows scanning electron microscope micrographs of the waveguide thus produced. The front part of the oxide layer was removed by the scribing, as a result of which the underlying metal-semiconductor-metal contact was revealed. The micrographs were taken at an angle of 45°. The micrograph illustrated in FIG. 9 (part B) shows the side view of the detector likewise at an angle of 45°. The smallest distance between the two metal electrodes is less than 100 nm.

Characterization of Plasmonic Photodetectors

Figure 10:
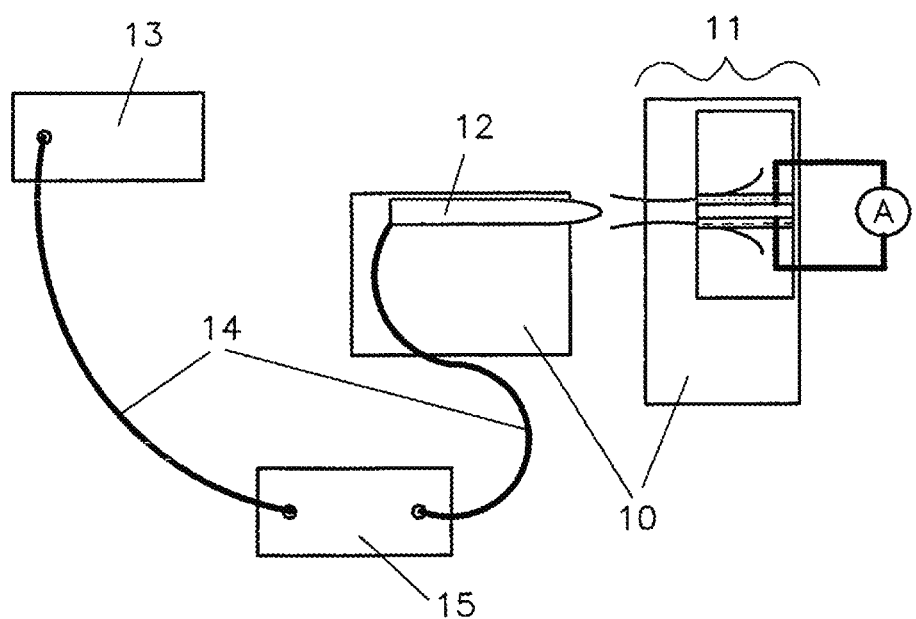
FIG. 10; shows an optical setup for the measurement of photoinduced currents.

The uncovered facet of the plasmonic waveguide was illuminated by a tapering fiber with a focal spot at the focus of 5 µm. The optical setup is illustrated in FIG. 10. An adjustable laser source ranging from 1270 nm to 1350 nm was used. After careful alignment of the polarization and the fiber position, the photocurrent was measured as a function of the photon energy used, the incident laser energy and the voltage applied to the photodiode externally.

It is assumed that the photocurrent has a power law dependence in relation to the photon energy in accordance with the formula for the photoelectric effect that was presented by Fowler in 1931. This formula was adapted to the case of internal photoemission (IPE) by using the height of the potential step, seen by an electron at the Fermi level (potential of the Fermi level subtracted from the potential of the barrier) between gold and silicon $\phi_{Au\text{-}Si}$. This formula applies to the present structure if no external voltage is applied, and reads as follows:

$$I_{photo} \propto \frac{(\hbar\omega - \phi_{Au-Si})^2}{(\chi_0 - \hbar\omega)},$$

wherein $\hbar\omega$ is the photon energy and $\chi_0$ is the total height of the potential step given by the interface.

Figure 11:
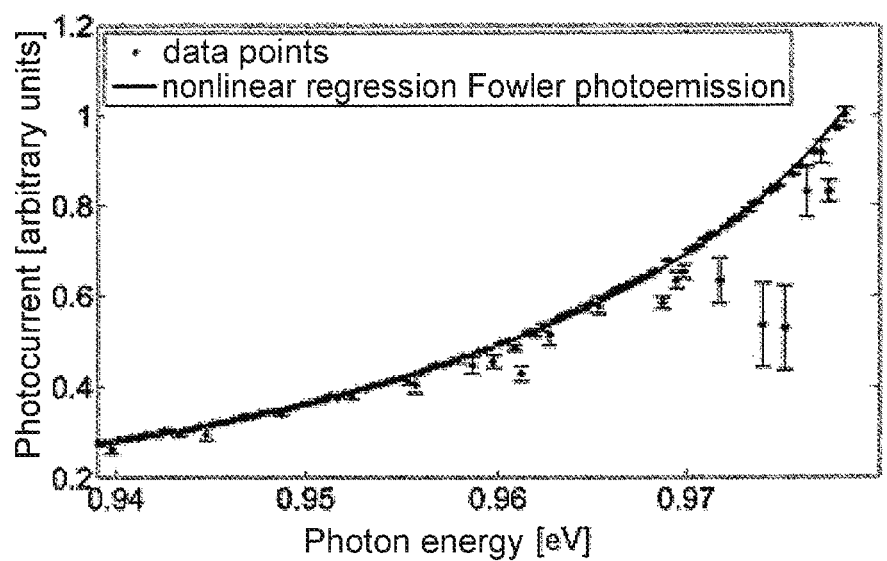
FIG. 11: shows the dependence of the photocurrent without applied voltage.

FIG. 11 shows the measured currents in relation to the photon energy. By adapting the formula to these data using the method of weighted least squares, the barrier height between gold and silicon was able to be obtained as a parameter. The barrier height obtained is $\phi_{Au\text{-}Si}$=0.82 eV, which corresponds well to literature indications for said barrier height (cf. Chen et al., "Current Transport and its Effect on the Schottky-Barrier Height in a typical System: Gold on Silicon", Solid-State Electronics, vol. 36, no. 7, pp. 949-954, 1993). This correspondence constitutes first evidence of internal photoemission (IPE).

Using the mode overlap integral, it was possible to estimate the minimum internal quantum efficiency in this structure, which is between 5 and 10% for an optical wavelength of 1270 nm and increases exponentially for shorter wavelengths. In this structure, the presence of IPE is not restricted to photons below the band gap energy of silicon. For photons of higher energy, i.e. in the visible range, the absorption in silicon is smaller by orders of magnitude in comparison with the metals.

Further series of measurements were carried out in order to determine the dependence of the photocurrent on the incident laser energy. In accordance with Fowler's theory, even if an external voltage is applied, a linear rise in the photocurrent with energy was expected. The results obtained are plotted in FIG. 12. Each line of the graph corresponds to a different applied voltage, wherein the dark currents of the diode were subtracted. The lowest curve was measured at −0.5 V, and the highest curve at 0.7 V. The difference between each curve is 50 mV.

Figure 12:
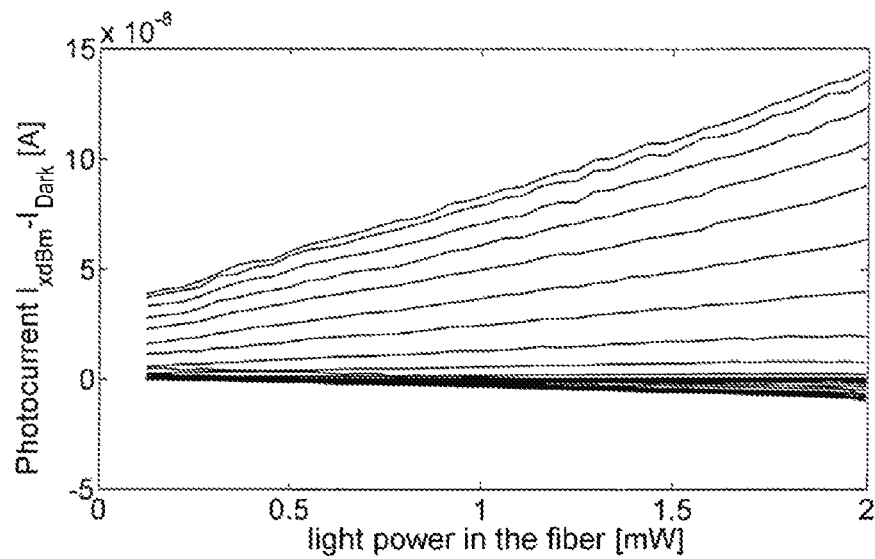
FIG. 12: shows measured photocurrents as a function of the incident light energy, wherein each line corresponds to a different applied voltage.

As shown in FIG. 12, the photocurrent increases with higher voltages. Positive currents correspond to the carrier injection of titanium; negative currents are transferred from gold. Each measured curve shows a linear dependence on energy. As was also discussed in the simulation above, it is found that the titanium electrode makes a greater contribution.

Figure 13:
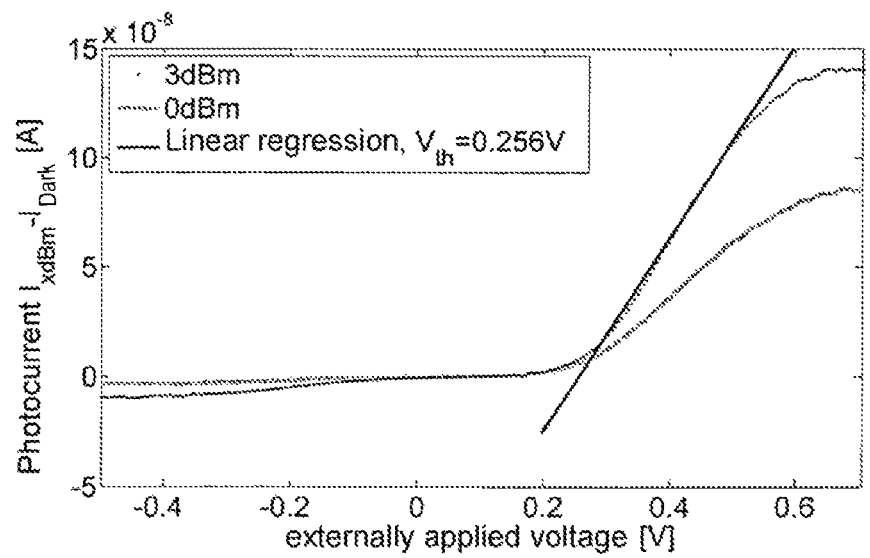
FIG. 13: shows the dependence of the photocurrents on the applied voltage with subtracted dark currents.

FIG. 13 shows the measured photocurrent dependence on the applied voltage. It is found that a limit voltage exists which separates the charge carrier injection of titanium from that of gold. The charge carriers are transferred from titanium for voltages greater than the limit voltage, and from gold for lower voltages. This voltage corresponds to the diffusion potential of the diode, which can be calculated by $V_{th}$=0.256 V. Consequently, the difference should result from the measured barrier height at the gold-silicon interface and the diffusion potential in the barrier height at the titanium-silicon interface, i.e. $\phi_{Ti\text{-}Si}=\phi_{Au\text{-}Si}-qV_{th}$=0.564 eV. This value is in the range of previous literature values ($\phi_{Ti\text{-}Si}$=0.5 eV to 0.6 eV) (cf. A. M. Cowley, "Titanium-Silicon Schottky Barrier Diodes", Solid-State Electronics, Pergamon Press 1970, vol. 12, pp. 403-414).

Production of Ultracompact Plasmonic Photowaveguides

Figure 14:
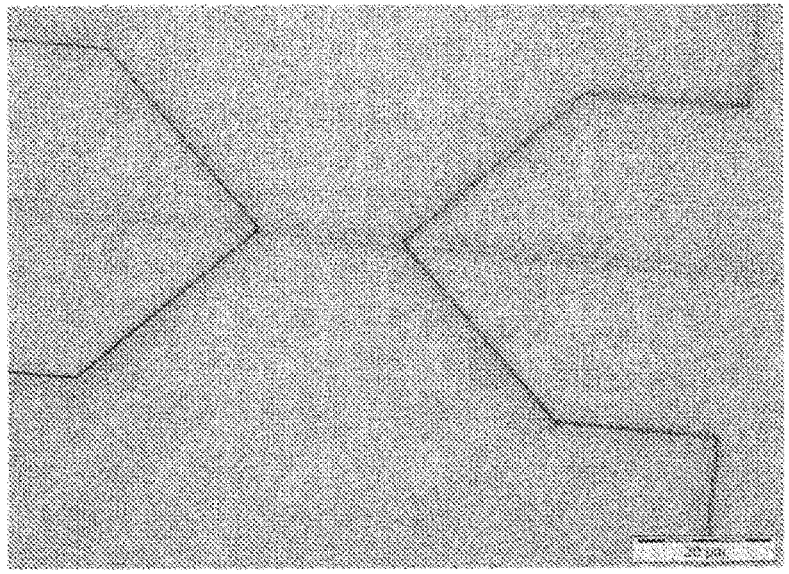
FIG. 14: shows an optical micrograph of a PMMA resist which defines electrodes of a plasmonic waveguide.
Figure 15:
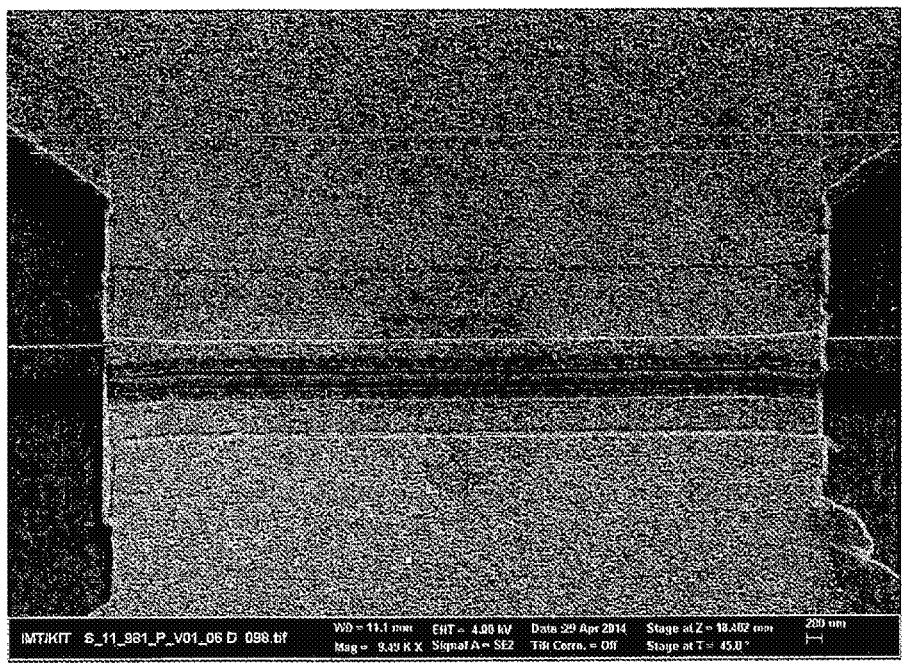
FIG. 15: shows a scanning electron microscope micrograph of a metalized photodetector in accordance with one preferred embodiment of the present invention.

The integration of active plasmonic waveguides into a photonic silicon platform requires the coupling of photonic and plasmonic regions. This was accomplished by firstly producing a photonic silicon waveguide on an SOI substrate. Afterward, the lengths of the plasmonic region and of the connected electrodes were defined by means of electron beam lithography (cf. FIG. 14), wherein the silicon waveguide and the oxide substrate were accessible for etching and metal deposition. The production method described above was subsequently carried out on the accessible parts of the waveguide, as a result of which a component as illustrated in FIG. 15 was obtained.

Figure 16A:
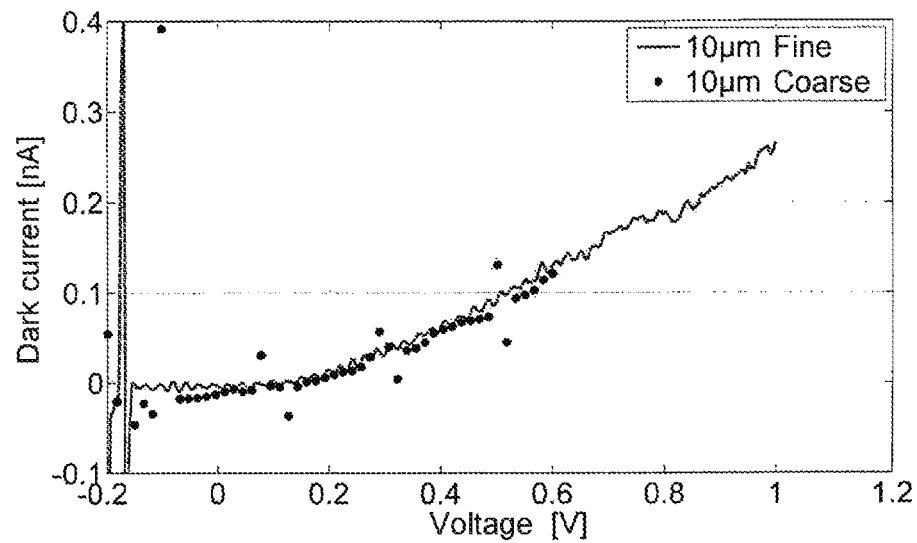
FIG. 16A: shows dark currents of plasmonic photodetectors having a length of 10 µm, wherein the dark current is close to the maximum resolution of the instrument used.
Figure 16B:
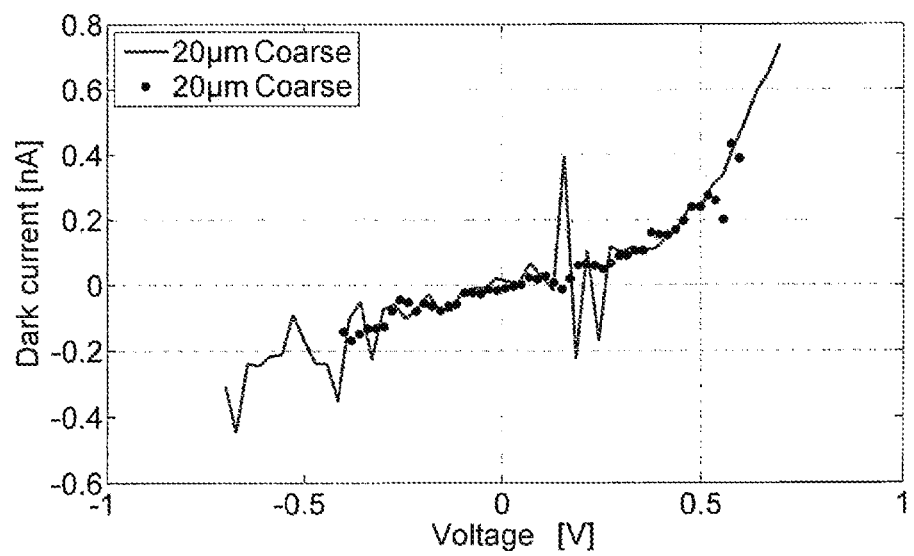
FIG. 16B: shows dark currents of plasmonic photodetectors having a length of 20 µm, wherein the dark current is close to the maximum resolution of the instrument used.

The dark currents of the plasmonic photodetector having lengths of 10 μm and 20 μm were measured, which are depicted in FIG. 16 (instruments: Agilent B2900A series, electrodes contacted on-chip with DC probes from Cascade Microtech Inc.). On account of the low signal strength, the series of measurements were carried out close to the resolution limit with a different time constant and voltage resolution, i.e. short averaging time and low voltage resolution (coarse). The procedure for "fine" was implemented correspondingly. In comparison with known plasmonic photodetectors, as described in M. Casalino et al., Optics Express, Vol. 21 (23), pp. 28072-28082 (2013), the dark current is smaller by an order of magnitude.

On account of the small cross section, the RC time constant is the crucial speed-determining variable. With an assumed capacitance of the order of magnitude of 1 fF/μm component length and a 50Ω connection to the external drive electronics, it was possible to estimate an RC time constant of approximately 0.25 ps and a resultant limiting frequency (maximum frequency) of 4 THz for a component having a length of 5 μm.

In view of the above results it was possible to show that on account of the linear rise in the photocurrent with the incident optical energy and the exponential rise with photonic energy, the photodetection in the described component takes place on the basis of internal photoemission. In particular, two-photon absorption, which would have shown a parabolic rise in the photocurrent with the incident optical energy, was able to be ruled out on the basis of the measurement data.

What is claimed:

1. A method for producing a plasmonic component comprising a metal-semiconductor-metal contact in which a first metal layer is separated from a second metal layer, which is different than the first metal layer, by a semiconductor layer having a thickness of 100 nm or less, the method comprising the following steps:
providing the semiconductor layer on a substrate, the semiconductor layer having surfaces;
providing an oxide layer at least partly on one of the surfaces of the semiconductor layer;
applying a structured resist layer at least partly on an opposite surface of the oxide layer relative to the semiconductor layer in such a way that regions with the resist layer and regions without the resist layer arise and regions with the resist layer correspond to a basic form of the metal-semiconductor-metal contact;
removing the oxide layer and the semiconductor layer in the regions without the resist layer to give rise to at least two lateral surfaces of the semiconductor layer;

laterally undercutting the oxide layer by isotropic etching, thereby producing a contour of the metal-semiconductor-metal contact in cross section; and applying at least a first metal layer and a second metal layer, each metal layer composed of a different metal, by angled vapor deposition on a first lateral surface and a second lateral surface respectively of the at least two lateral surfaces of the semiconductor layer to form the metal-semiconductor-metal contact, wherein the first metal layer is not in direct contact with the second metal layer, wherein the first metal layer consists of a metal selected from the group consisting of gold, silver and aluminum and alloys thereof, and the second metal layer consists of a metal selected from the group consisting of titanium, chromium, copper, zirconium, nickel, palladium, platinum, tin, lead and bismuth and alloys thereof, and wherein the first and second metal layers are selected in such a way that electromagnetic waves are predominantly absorbed in the second metal layer and the the second metal layer exhibiting high absorption with a low potential barrier with respect to the semiconductor layer.

2. The method as claimed in claim 1, wherein the plasmonic component is present in the form of a waveguide.

3. The method as claimed in claim 1, wherein the structured resist layer is applied by means of electron or ion beam or laser lithography.

4. The method as claimed in claim 1, wherein the first metal layer is applied at least on a first surface of the semiconductor layer, and the second metal layer is applied on the surface of the semiconductor layer situated opposite the first surface.

5. A method for producing a plasmonic photodetector comprising
providing a plasmonic component prepared by using the method of claim 1; and
coupling the plasmonic component to a voltage to be applied.

6. The method as claimed in claim 5, wherein the plasmonic component is coupled to a photonic silicon waveguide.

7. A plasmonic component comprising a metal-semiconductor-metal contact, the metal-semiconductor-metal contact comprising:
a first metal layer;
a second metal layer, wherein the second metal layer is different from the first metal layer;
a semiconductor layer; and
an undercut oxide layer,
wherein the first metal layer is separated from the second metal layer by the semiconductor layer, the semiconductor layer having a thickness of less than 100 nm, and by the undercut oxide layer,
wherein the first metal layer is not in direct contact with the second metal layer,
wherein the first metal layer consists of a metal selected from the group consisting of gold, silver and aluminum and alloys thereof, and the second metal layer consists of a metal selected from the group consisting of titanium, chromium, copper, zirconium, nickel, palladium, platinum, tin, lead and bismuth and alloys thereof, and
wherein the first and second metal layers are selected in such a way that electromagnetic waves are predominantly absorbed in the second metal layer and the second metal layer exhibiting high absorption with a low potential barrier with respect to the semiconductor layer.

8. The plasmonic component as claimed in claim 7, wherein the plasmonic component is in the form of a waveguide having a first electrode and a second electrode in which the first electrode in the form of first metal layer is separated from a second electrode in the form of the second metal layer by the semiconductor layer, wherein second metal layer is different than the first metal layer, and wherein the first metal layer is not in direct contact with the second metal layer.

9. The plasmonic component as claimed in claim 7, wherein the length of the metal-semiconductor-metal contact is 0.5 µm to 100 µm.

10. A plasmonic photodetector comprising the plasmonic component as claimed in claim 7, wherein the first metal layer and the second metal layer constitute electrodes at which the photodetection takes place.

11. The plasmonic photodetector as claimed in claim 10, wherein the electrodes are a photoactive electrode and a counterelectrode.

12. The plasmonic photodetector as claimed in claim 10, wherein the plasmonic component is coupled directly to a photonic silicon waveguide.

13. An amplifier, electro-optical transducer or phase shifter comprising the plasmonic component of claim 7.

14. An optical chip-chip connection, an on chip connection, or free space optics comprising the plasmonic photodetector as claimed in claim 10 for the photodetection in the infrared range and visible range of the light spectrum.

* * * * *